(12) United States Patent
Byoun

(10) Patent No.: US 9,666,224 B1
(45) Date of Patent: May 30, 2017

(54) DATA STORAGE DEVICE ADAPTIVELY ESTIMATING SPINDLE MOTOR CURRENT

(71) Applicant: Western Digital Technologies, Inc., Irvine, CA (US)

(72) Inventor: Jaesoo Byoun, Irvine, CA (US)

( * ) Notice: Subject to any disclaimer, the term of this patent is extended or adjusted under 35 U.S.C. 154(b) by 0 days.

(21) Appl. No.: 15/051,414

(22) Filed: Feb. 23, 2016

(51) Int. Cl.
*G11B 21/02* (2006.01)
*G11B 19/20* (2006.01)
*G01R 19/00* (2006.01)
*G01R 19/04* (2006.01)

(52) U.S. Cl.
CPC ........ *G11B 19/2009* (2013.01); *G01R 19/003* (2013.01); *G01R 19/04* (2013.01)

(58) Field of Classification Search
None
See application file for complete search history.

(56) References Cited

U.S. PATENT DOCUMENTS

| | | | |
|---|---|---|---|
| 5,223,771 A | 6/1993 | Chari | |
| 5,959,417 A | 9/1999 | Maggio et al. | |
| 6,879,128 B2 | 4/2005 | Coutu et al. | |
| 6,934,135 B1 * | 8/2005 | Ryan | G11B 19/04 361/23 |
| 6,972,539 B1 * | 12/2005 | Codilian | G11B 19/28 318/432 |
| 7,006,320 B1 * | 2/2006 | Bennett | G11B 19/20 360/70 |
| 7,158,329 B1 | 1/2007 | Ryan | |
| 7,253,582 B1 | 8/2007 | Ding et al. | |
| 8,217,615 B2 * | 7/2012 | Tan | H02P 6/28 318/400.01 |
| 8,698,432 B2 * | 4/2014 | Kern | H02P 7/04 318/400.01 |
| 8,729,840 B2 | 5/2014 | Miura | |
| 9,197,144 B2 * | 11/2015 | Lin | H02P 6/001 |
| 2008/0265819 A1 | 10/2008 | Chen et al. | |
| 2010/0134060 A1 | 6/2010 | Vermeir | |
| 2014/0232310 A1 | 8/2014 | Bartalucci et al. | |

* cited by examiner

Primary Examiner — K. Wong

(57) ABSTRACT

A data storage device is disclosed comprising a head actuated over a disk and a spindle motor configured to rotate the disk, wherein the spindle motor comprises a stator, a rotor, and a plurality of windings. The data storage device further comprises control circuitry comprising a spindle motor driver comprising a plurality of switches including a first switch and a second switch configured to commutate the windings. A current flowing through the first switch is measured for a first part of an electrical cycle of the spindle motor. The measured current is processed to generate an estimated current flowing through the second switch during a second part of the electrical cycle of the spindle motor, wherein the first part of the electrical cycle is different from the second part of the electrical cycle.

17 Claims, 4 Drawing Sheets

DATA STORAGE DEVICE ADAPTIVELY ESTIMATING SPINDLE MOTOR CURRENT

BACKGROUND

Data storage devices such as disk drives comprise a disk and a head connected to a distal end of an actuator arm which is rotated about a pivot by a voice coil motor (VCM) to position the head radially over the disk. The disk comprises a plurality of radially spaced, concentric tracks for recording user data sectors and servo sectors. The servo sectors comprise head positioning information (e.g., a track address) which is read by the head and processed by a servo control system to control the actuator arm as it seeks from track to track.

FIG. 1 shows a prior art disk format 2 as comprising a number of servo tracks 4 defined by servo sectors $6_0$-$6_N$ recorded around the circumference of each servo track. Each servo sector $6_i$ comprises a preamble 8 for storing a periodic pattern, which allows proper gain adjustment and timing synchronization of the read signal, and a sync mark 10 for storing a special pattern used to symbol synchronize to a servo data field 12. The servo data field 12 stores coarse head positioning information, such as a servo track address, used to position the head over a target data track during a seek operation. Each servo sector $6_i$ further comprises groups of servo bursts 14 (e.g., N and Q servo bursts), which are recorded with a predetermined phase relative to one another and relative to the servo track centerlines. The phase based servo bursts 14 provide fine head position information used for centerline tracking while accessing a data track during write/read operations. A position error signal (PES) is generated by reading the servo bursts 14, wherein the PES represents a measured position of the head relative to a centerline of a target servo track. A servo controller processes the PES to generate a control signal applied to a head actuator (e.g., a voice coil motor) in order to actuate the head radially over the disk in a direction that reduces the PES.

DETAILED DESCRIPTION

Figure 2A:
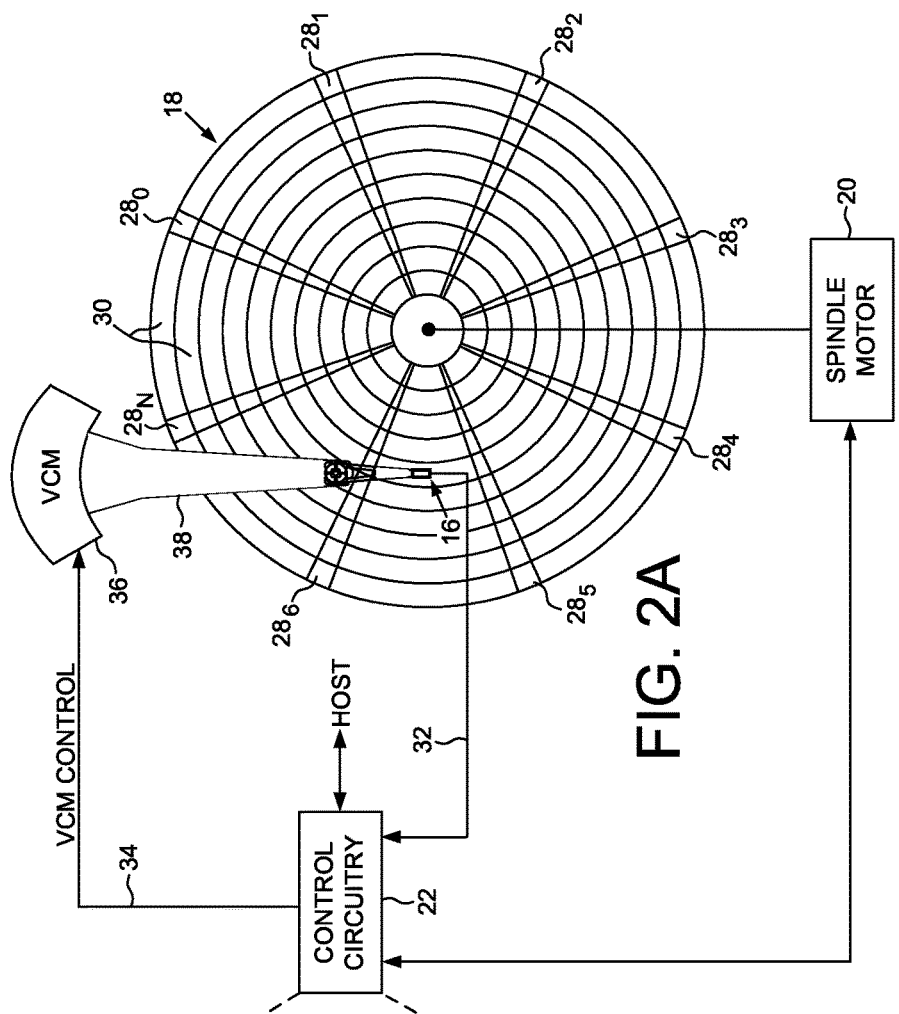
FIG. 2A shows a data storage device in the form of a disk drive according to an embodiment comprising a head actuated over a disk, and a spindle motor comprising a plurality of windings commutated by switches to rotate the disk.
Figure 2B:
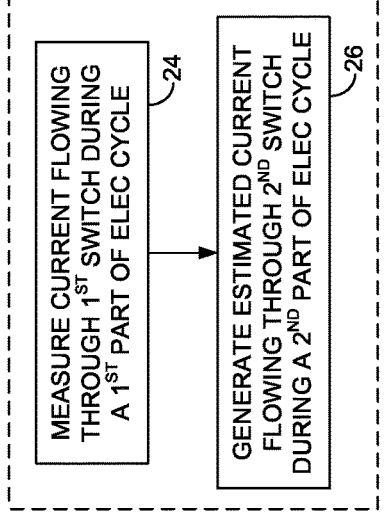
FIG. 2B is a flow diagram according to an embodiment wherein a current flowing through a first switch is measured for a first part of an electrical cycle of the spindle motor, and the measured current is processed to generate an estimated current flowing through a second switch during a second part of the electrical cycle of the spindle motor.

FIG. 2A shows a data storage device in the form of a disk drive according to an embodiment comprising a head 16 actuated over a disk 18 and a spindle motor 20 configured to rotate the disk 18, wherein the spindle motor 20 comprises a stator, a rotor, and a plurality of windings. The data storage device further comprises control circuitry 22 comprising a spindle motor driver comprising a plurality of switches including a first switch and a second switch configured to commutate the windings. The control circuitry 22 executes the flow diagram of FIG. 2B, wherein a current flowing through the first switch is measured for a first part of an electrical cycle of the spindle motor (block 24). The measured current is processed to generate an estimated current flowing through the second switch during a second part of the electrical cycle of the spindle motor, wherein the first part of the electrical cycle is different from the second part of the electrical cycle (block 26).

Figure 1:
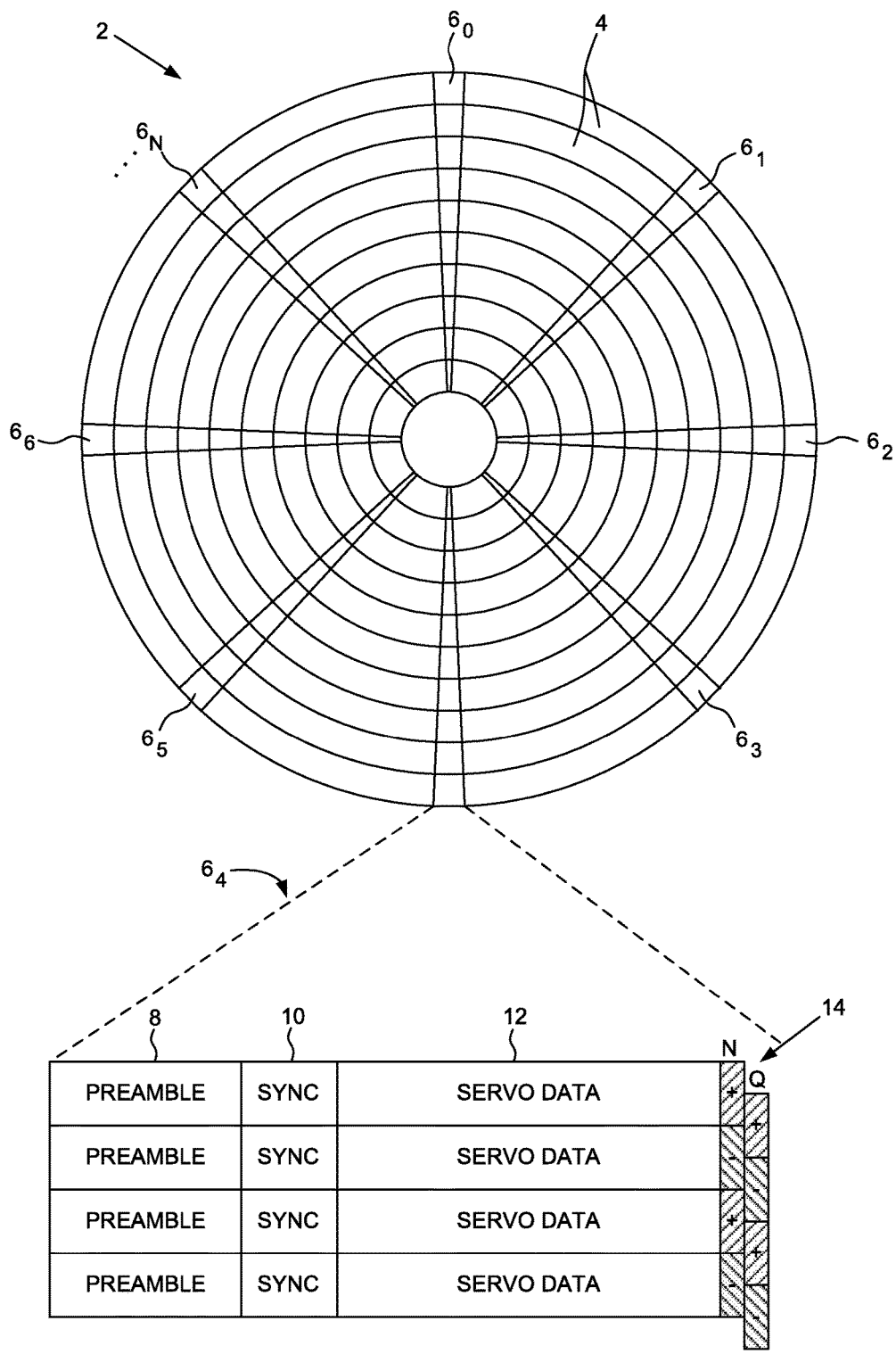
FIG. 1 shows a prior art disk format comprising a plurality of servo tracks defined by servo sectors.

In the embodiment of FIG. 2A, the disk 18 comprises a plurality of servo sectors $28_0$-$28_N$ that define servo tracks 30, wherein the servo sectors $28_0$-$28_N$ may comprise any suitable head position information, such as a track address for coarse positioning and servo bursts for fine positioning. The servo bursts may comprise any suitable pattern, such as an amplitude based servo pattern or a phase based servo pattern (FIG. 1). Data tracks may be defined relative to the servo tracks 30 at the same or different radial density. The control circuitry 22 processes a read signal 32 emanating from the head 16 to demodulate the servo sectors $28_0$-$28_N$ and generate a position error signal (PES) representing an error between the actual position of the head and a target position relative to a target track. A servo control system in the control circuitry 22 filters the PES using a suitable compensation filter to generate a control signal 34 applied to a voice coil motor (VCM) 36 which rotates an actuator arm 38 about a pivot in order to actuate the head 16 radially over the disk 18 in a direction that reduces the PES as the spindle motor 20 rotates the disk 18.

Figure 3:
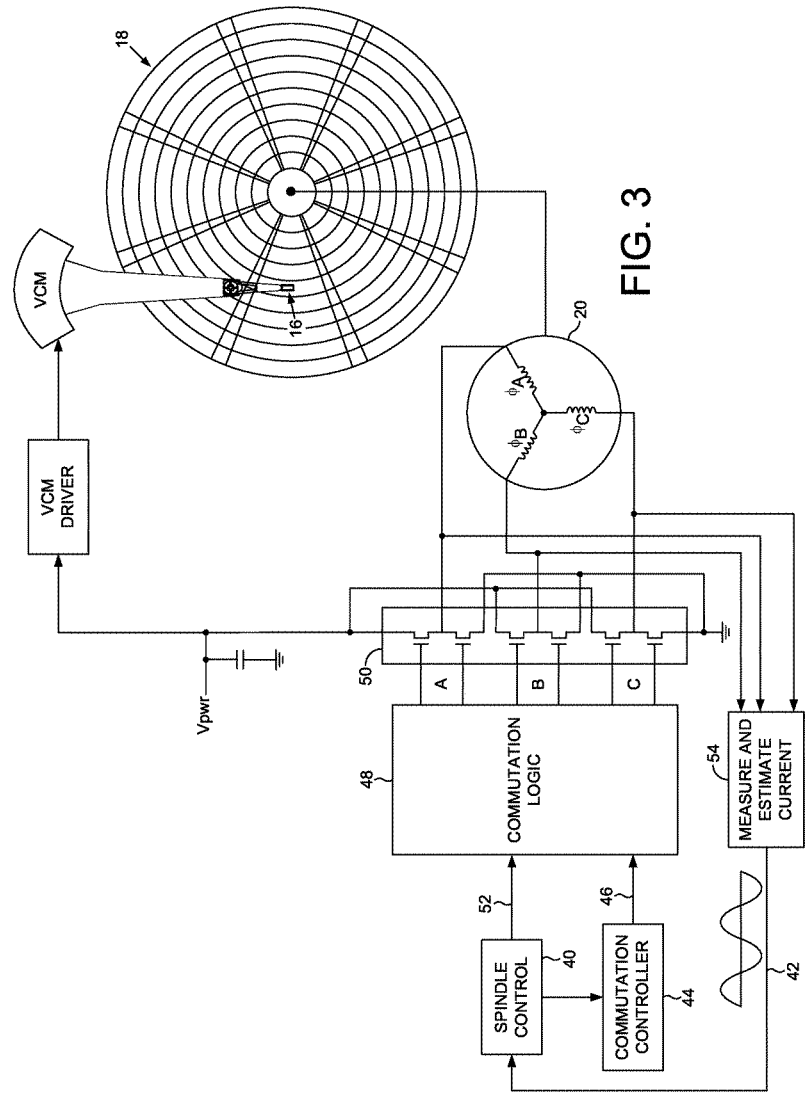
FIG. 3 shows control circuitry according to an embodiment for commutating the windings of the spindle motor based on the estimated current.

FIG. 3 shows spindle motor driver control circuitry according to an embodiment for commutating the windings of the spindle motor 20 in order to rotate the disk 18. A spindle control block 40 processes a signal 42 which represents the current flowing through the windings, and therefore the position of the rotor relative to the stator, in order to sequence through the states of a commutation controller 44. The commutation controller 44 generates a control signal 46 applied to commutation logic 48 to control the state of switches 50 in order to drive the windings with supply voltage Vpwr. The commutation logic 48 may operate in any suitable manner, such as by driving the switches 50 as linear amplifiers that apply continuous-time sinusoidal voltages to the windings. In another embodiment, the commutation logic 48 may drive the switches 50 using pulse width modulation (PWM), such as using square wave PWM, trapezoidal PWM, or sinusoidal PWM. Regardless as to how the windings are driven, the spindle control bock 40 commands the commutation controller 44 to generate control signal 46 so that the windings are commutated at the correct periods, thereby generating the desired rotating magnetic field that causes the spindle motor to rotate. In one embodiment, the spindle control block 40 may generate a control signal 52 that controls the effective amplitude of the periodic driving voltage applied to the windings (continuous or PWM), thereby controlling the speed of the spindle motor 20. Block 54 measures the current flowing through the windings for at least part of an electrical cycle of the spindle motor 20, and estimates the current flowing through the windings for a second part of the electrical cycle of the spindle motor 20, thereby generating a complete (or near complete) representation of the current flowing through the windings (signal 42 in FIG. 3) as the spindle motor rotates.

Figure 4:
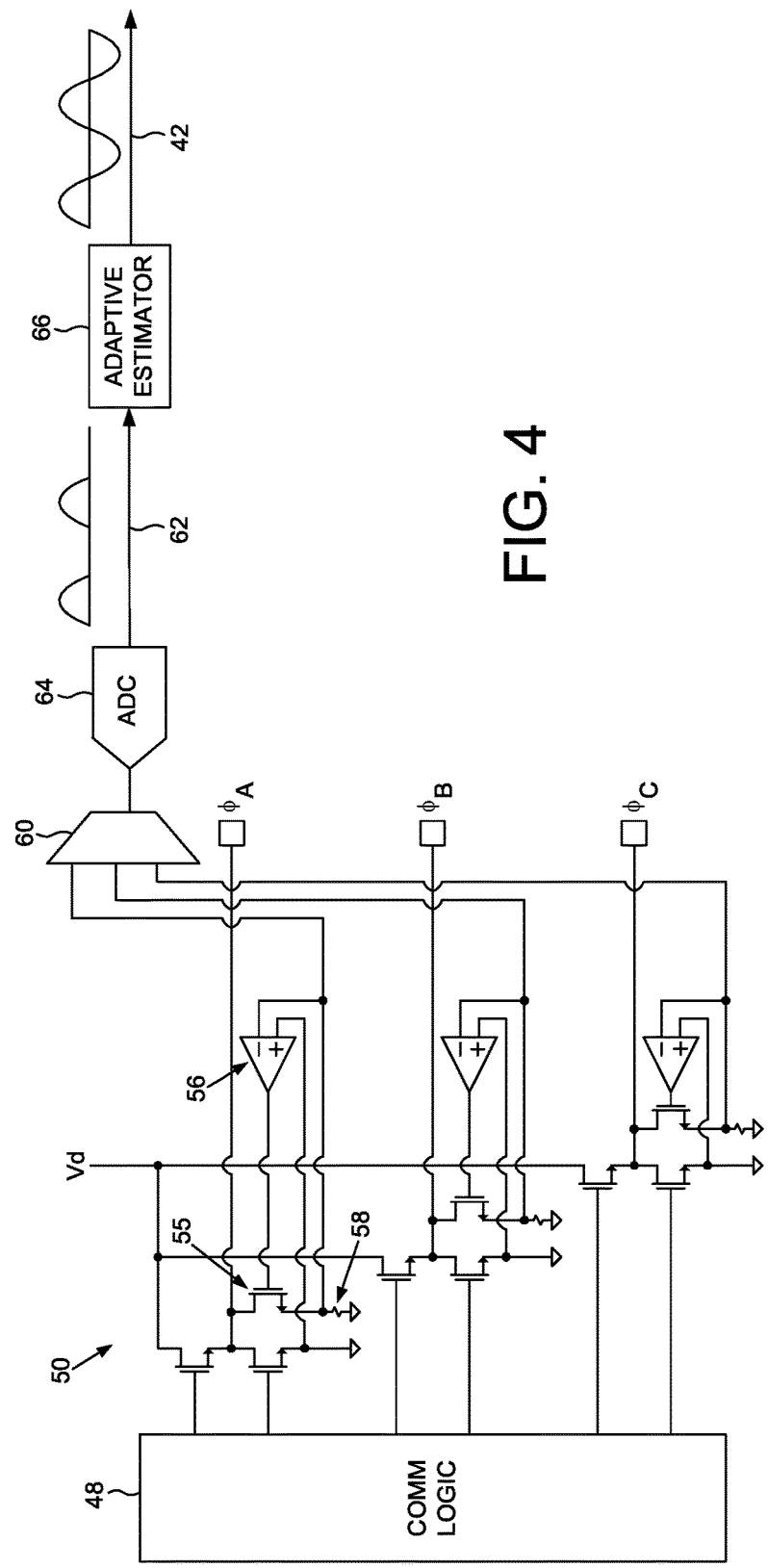
FIG. 4 shows control circuitry according to an embodiment wherein the current flowing through a low-side switch is measured during a positive half of an electrical cycle and the current flowing through a high-side switch is estimated during a negative half of the electrical cycle.

Any suitable control circuitry may be employed to measure the current flowing through the windings during the first part of the electrical cycle, and to estimate the current flowing through the windings during the second part. FIG. 4 shows example control circuitry according to an embodiment wherein the switches 50 comprise a high side switch for sourcing current to the windings from the supply voltage Vpwr, and a low-side switch for sinking current from the windings to ground (or alternatively to a negative supply voltage). The current flowing through each low-side switch is measured during a positive half of an electrical cycle and the current flowing through each high-side switch is estimated during the negative half of the electrical cycle. In the embodiment of FIG. 4, the current flowing through each low-side switch is measured using a current mirror, where each current mirror comprises a current mirror transistor 55, a differential amplifier 56, and a sense resistor 58. In this configuration, the voltage across the sense resistor 58 represents the magnitude of the current flowing through the respective winding as current flows from the winding to ground. A multiplexer 60 is configured to select the winding that is currently being driven during the current commutation cycle, and the voltage representing the measured current is converted into a digital value 62 using a suitable analog-to-digital converter (ADC) 64. An adaptive estimator 66 processes the digital values 62 to generate the estimated current representing the negative part of the electrical cycle as shown in FIG. 4.

The adaptive estimator 66 may process the measured current 62 to generate the estimated current in any suitable manner. In one embodiment, the adaptive estimator 66 processes the measured current 62 to generate a sinusoidal signal 42 that represents the estimated current flowing through the windings over the entire electrical cycle. That is, the adaptive estimator generates a sinusoidal signal based on:

$$d(k)*\cos(\theta(k)+\phi)+q(k)*\sin(\theta(k)+\phi)$$

where d(k) and q(k) represent coefficients of the sinusoid, and φ represents a phase of the electrical cycle (e.g., one phase of a three-phase spindle motor). In one embodiment, the adaptive estimator 66 adapts the coefficients d(k) and q(k) of the sinusoid based on:

$$d(k+1)=d(k)+\gamma \cdot e(k) \cdot \cos(\theta(k)+\phi)$$

$$q(k+1)=q(k)+\gamma \cdot e(k) \cdot \sin(\theta(k)+\phi)$$

where e(k) is an error term based on a difference between the measured current and the estimated current (the current generated based on the sinusoid over the positive half of the electrical cycle), and γ represents a learning gain that determines the speed and stability of convergence.

In an alternative embodiment, the control circuitry may measure the current flowing through the high-side switches shown in FIG. 4 in order to measure the current flowing through the windings during the negative half of an electrical cycle, and estimate the current flowing through the windings during the positive half of an electrical cycle. This embodiment may employ a current mirror for each of the high-side switches such as shown in FIG. 4, or in an alternative embodiment, the control circuitry may employ a single current sensor coupled to the supply voltage Vpwr (e.g., a current mirror coupled to an isolation transistor) in order to measure the current flowing through the high-side switches.

In other embodiments, the control circuitry may generate the measured current over less than half an electrical cycle of the spindle motor in order to adapt the function that represents the estimated current over the entire electrical cycle. For example, in one embodiment the current mirrors shown in FIG. 4 may be enabled to measure the current flowing through the windings over less than the positive half of the electrical cycle (e.g., over one-quarter of the positive half of the electrical cycle).

Any suitable control circuitry may be employed to implement the flow diagrams in the above embodiments, such as any suitable integrated circuit or circuits. For example, the control circuitry may be implemented within a read channel integrated circuit, or in a component separate from the read channel, such as a disk controller, or certain operations described above may be performed by a read channel and others by a disk controller. In one embodiment, the read channel and disk controller are implemented as separate integrated circuits, and in an alternative embodiment they are fabricated into a single integrated circuit or system on a chip (SOC). In addition, the control circuitry may include a suitable preamp circuit implemented as a separate integrated circuit, integrated into the read channel or disk controller circuit, or integrated into a SOC.

In one embodiment, the control circuitry comprises a microprocessor executing instructions, the instructions being operable to cause the microprocessor to perform the flow diagrams described herein. The instructions may be stored in any computer-readable medium. In one embodiment, they may be stored on a non-volatile semiconductor memory external to the microprocessor, or integrated with the microprocessor in a SOC. In another embodiment, the instructions are stored on the disk and read into a volatile semiconductor memory when the disk drive is powered on. In yet another embodiment, the control circuitry comprises suitable logic circuitry, such as state machine circuitry.

In various embodiments, a disk drive may include a magnetic disk drive, an optical disk drive, etc. In addition, while the above examples concern a disk drive, the various embodiments are not limited to a disk drive and can be applied to other data storage devices and systems, such as magnetic tape drives, solid state drives, hybrid drives, etc. In addition, some embodiments may include electronic devices such as computing devices, data server devices, media content storage devices, etc. that comprise the storage media and/or control circuitry as described above.

The various features and processes described above may be used independently of one another, or may be combined in various ways. All possible combinations and subcombinations are intended to fall within the scope of this disclosure. In addition, certain method, event or process blocks may be omitted in some implementations. The methods and processes described herein are also not limited to any particular sequence, and the blocks or states relating thereto can be performed in other sequences that are appropriate. For example, described tasks or events may be performed in an order other than that specifically disclosed, or multiple may be combined in a single block or state. The example tasks or events may be performed in serial, in parallel, or in some other manner. Tasks or events may be added to or removed from the disclosed example embodiments. The example systems and components described herein may be configured differently than described. For example, elements may be added to, removed from, or rearranged compared to the disclosed example embodiments.

While certain example embodiments have been described, these embodiments have been presented by way of example only, and are not intended to limit the scope of the inventions disclosed herein. Thus, nothing in the foregoing description is intended to imply that any particular feature, characteristic, step, module, or block is necessary or indispensable. Indeed, the novel methods and systems described herein may be embodied in a variety of other forms; furthermore, various omissions, substitutions and changes in the form of the methods and systems described herein may be made without departing from the spirit of the embodiments disclosed herein.

What is claimed is:

1. A data storage device comprising:
   a disk;
   a head actuated over the disk;
   a spindle motor configured to rotate the disk, wherein the spindle motor comprises a stator, a rotor, and a plurality of windings; and
   control circuitry comprising a spindle motor driver comprising a plurality of switches including a first switch and a second switch configured to commutate the windings, the control circuitry configured to:
      measure a current flowing through the first switch for a first part of an electrical cycle of the spindle motor; and
      process the measured current to generate an estimated current flowing through the second switch during a second part of the electrical cycle of the spindle motor, wherein the first part of the electrical cycle is different from the second part of the electrical cycle.

2. The data storage device as recited in claim 1, wherein:
   the first switch is a low-side switch configured to sink current from at least one of the windings; and
   the second switch is a high-side switch configured to supply current to at least one of the windings.

3. The data storage device as recited in claim 2, wherein:
   the first part of the electrical cycle is approximately half of the electrical cycle representing positive current flowing through the first switch; and
   the second part of the electrical cycle is approximately half of the electrical cycle representing negative current flowing through the first switch.

4. The data storage device as recited in claim 1, wherein the control circuitry is further configured to generate the estimated current based on coefficients of a sinusoid.

5. The data storage device as recited in claim 4, wherein the control circuitry is further configured to adapt the coefficients of the sinusoid based on an error, wherein the error is based on a difference between the measured current and the estimated current.

6. The data storage device as recited in claim 5, wherein the control circuitry is further configured to adapt the coefficients of the sinusoid based on:

$$d(k+1)=d(k)+\gamma \cdot e(k) \cdot \cos(\theta(k)+\phi)$$

$$q(k+1)=q(k)+\gamma \cdot e(k) \cdot \sin(\theta(k)+\phi)$$

where:
$d(k)$ and $q(k)$ represent the coefficients of the sinusoid;
$e(k)$ represents the error;
$\gamma$ represents a learning gain; and
$\phi$ represents a phase of the electrical cycle.

7. The data storage device as recited in claim 6, wherein the control circuitry is further configured to generate the estimated current based on:

$$d(k)*\cos(\theta(k)+\phi)+q(k)*\sin(\theta(k)+\phi).$$

8. The data storage device as recited in claim 1, wherein the control circuitry is further configured to commutate the windings by controlling the switches based on at least the estimated current.

9. A method of operating a data storage device, the method comprising:
   controlling a plurality of switches including a first switch and a second switch in order to commutate windings of a spindle motor;
   measuring a current flowing through the first switch for a first part of an electrical cycle of the spindle motor; and
   processing the measured current to generate an estimated current flowing through the second switch during a second part of the electrical cycle of the spindle motor, wherein the first part of the electrical cycle is different from the second part of the electrical cycle.

10. The method as recited in claim 9, wherein:
    the first switch is a low-side switch configured to sink current from at least one of the windings; and
    the second switch is a high-side switch configured to supply current to at least one of the windings.

11. The method as recited in claim 10, wherein:
    the first part of the electrical cycle is approximately half of the electrical cycle representing positive current flowing through the first switch; and
    the second part of the electrical cycle is approximately half of the electrical cycle representing negative current flowing through the first switch.

12. The method as recited in claim 9, further comprising generating the estimated current based on coefficients of a sinusoid.

13. The method as recited in claim 12, further comprising adapting the coefficients of the sinusoid based on an error, wherein the error is based on a difference between the measured current and the estimated current.

14. The method as recited in claim 13, further comprising adapting the coefficients of the sinusoid based on:

$$d(k+1)=d(k)+\gamma \cdot e(k) \cdot \cos(\theta(k)+\phi)$$

$$q(k+1)=q(k)+\gamma \cdot e(k) \cdot \sin(\theta(k)+\phi)$$

where:
$d(k)$ and $q(k)$ represent the coefficients of the sinusoid;
$e(k)$ represents the error;
$\gamma$ represents a learning gain; and
$\phi$ represents a phase of the electrical cycle.

15. The method as recited in claim 14, further comprising generating the estimated current based on:

$$d(k)*\cos(\theta(k)+\phi)+q(k)*\sin(\theta(k)+\phi).$$

16. The method as recited in claim 9, further comprising commutating the windings by controlling the switches based on at least the estimated current.

17. Control circuitry comprising a spindle motor driver comprising a plurality of switches including a first switch and a second switch configured to commutate windings of a spindle motor, the control circuitry configured to:
   measure a current flowing through the first switch for a first part of an electrical cycle of the spindle motor; and
   process the measured current to generate an estimated current flowing through the second switch during a second part of the electrical cycle of the spindle motor, wherein the first part of the electrical cycle is different from the second part of the electrical cycle.

* * * * *